(12) United States Patent
Ueda et al.

(10) Patent No.: US 6,420,055 B1
(45) Date of Patent: *Jul. 16, 2002

(54) ORGANIC ELECTROLUMINESCENT ELEMENT

(75) Inventors: Hideaki Ueda, Kishiwada; Keiichi Furukawa; Yoshihisa Terasaka, both of Suita, all of (JP)

(73) Assignee: Minolta Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/162,569

(22) Filed: Sep. 29, 1998

(30) Foreign Application Priority Data

Sep. 30, 1997 (JP) .............................. 9-267036

(51) Int. Cl.[7] .......................... H05B 33/26; H05B 33/00
(52) U.S. Cl. ....................... 428/690; 313/503; 313/505; 257/101
(58) Field of Search ................ 313/505, 503; 428/690, 917; 257/101

(56) References Cited

U.S. PATENT DOCUMENTS

| 3,530,325 A | | 9/1970 | Mehl et al. ................. 428/457 |
| 4,539,507 A | | 9/1985 | VanSlyke et al. ........... 313/504 |
| 4,720,432 A | | 1/1988 | VanSlyke et al. ........... 313/504 |
| 4,885,211 A | | 12/1989 | Tang et al. ................ 428/457 |
| 5,047,687 A | * | 9/1991 | VanSlyke .................... 313/503 |
| 5,059,862 A | * | 10/1991 | VanSlyke et al. ........... 313/503 |
| 5,429,884 A | | 7/1995 | Namiki et al. .............. 428/690 |
| 5,458,977 A | * | 10/1995 | Hosokawa et al. ......... 428/411.1 |
| 5,811,833 A | * | 9/1998 | Thompson ................... 257/40 |
| 5,861,219 A | * | 1/1999 | Thompson et al. .......... 428/690 |
| 5,904,994 A | * | 5/1999 | Dodabalapur et al. ...... 428/690 |
| 5,965,281 A | * | 10/1999 | Cao .......................... 428/690 |
| 6,045,930 A | * | 4/2000 | Thompson et al. .......... 428/690 |
| 6,060,826 A | * | 5/2000 | Ueda et al. ................. 313/498 |
| 6,130,001 A | * | 10/2000 | Shi et al. .................... 428/690 |

FOREIGN PATENT DOCUMENTS

| JP | 2-15595 | 1/1990 |
| JP | 03037994 A | 2/1991 |
| JP | 04132191 A | 5/1992 |
| JP | 05121172 A | 5/1993 |
| JP | 09232079 A | 9/1997 |

* cited by examiner

Primary Examiner—Cynthia H. Kelly
Assistant Examiner—Dawn Garrett
(74) Attorney, Agent, or Firm—Morrison & Foerster, LLP

(57) ABSTRACT

The object of the invention is to provide an organic electroluminescent element which reduces the luminescence starting voltage, increases the luminescence brightness, and has excellent stability with repeated use. The organic electroluminescent element includes at least a positive electrode, a luminescing layer and a negative electrode, which includes a compound layer of magnesium and a metal having a higher work function than magnesium. The exterior side of the compound layer has a higher percentage of the metal than magnesium and the interior side of the compound layer has a higher percentage of magnesium than the metal.

19 Claims, 2 Drawing Sheets

ORGANIC ELECTROLUMINESCENT ELEMENT

RELATED APPLICATIONS

This application is based on Application No. HEI 9-267036 filed in Japan, the content of which is hereby incorporated by reference.

BACKGROUND OF THE INVENTION

1. Field of the Invention

The present invention relates to an organic electroluminescent element.

2. Description of the Related Art

Organic electroluminescent elements are elements constructed using organic compounds as luminescent materials which emit light in response to electric signals.

Organic electroluminescent elements have a basic structure of an organic luminescent layer interposed between a pair of opposing electrodes. Electroluminescence is a phenomenon wherein electrons are injected from one electrode and holes are injected from another electrode so as to excite an illuminant within the luminescent layer to a higher energy level, and excess energy is discharged as light when the illuminant returns to its original base state.

In addition to the aforesaid basic structure, a hole injecting layer is added to the electrode which injects holes and an electron transporting layer is added to the electrode injecting electrons so as to improve luminance efficiency.

An example of an organic electoluminescent element is disclosed in U.S. Pat. No. 3,530,325, which describes an electroluminescent element using a monocrystal anthracene as a luminant.

U.S. Pat. No. 4,539,507 discloses an organic electroluminescent element combining a hole injecting layer and an organic electroluminescent layer.

U.S. Pat. No. 4,720,432 discloses an organic electroluminescent element combining an organic hole injecting layer and an organic electron injecting layer.

These electroluminescent elements with multi-layer structures comprise multiple layers of an organic fluorescent body, charge-transporting organic material (charge-transporting member), and electrodes, wherein luminescence is accomplished by holes and electrons injected by said respective electrodes moving through said charge-transporting member and again coupling. Examples of organic fluorescent bodies include organic colorants which fluoresce such as 8-quinolinol aluminum complex. Examples of charge-transporting materials include N,N'-di(m-tolyl)N,N'-diphenylbenzidene, diamino compounds such as 1,1-bis[N,N-di(p-tolyl)aminophenyl]cyclohexane and the like, and 4-(N,N-diphenyl)aminobenzaldehyde-N,N-diphenylhydrazone compounds and the like. Porphyrin compounds such as copper phthalocyanine have also been proposed.

Although organic electroluminescent elements have high luminance characteristics, they also are unstable when luminescing and have poor stability during storage so as to be impractical for use. One disadvantage of the aforesaid elements regarding storage stability and stability during luminescence pertains to the stability of the charge-transporting material. The layers of the electroluminescent element formed of organic material are quite thin at 100 to several hundred nanometers, and an extremely high voltage is applied to the layer per unit thickness. Heat is generated by luminescence and current flow, such that electrical, thermal, and chemical stability is required by the charge-transporting material.

Japanese Laid-Open Patent Nos. HEI 2-15595, 3-37994, 4-132191, and 5-121172 disclose elements which replace the conventionally used aluminum with a negative electrode to reduce the luminescence starting voltage of the organic electroluminescent element.

Further disadvantages arise, however when metals other than aluminum are used, inasmuch as the layer formation conditions become more difficult, oxidation may occur during layer formation, black spots become prevalent when luminescing.

OBJECTS AND SUMMARY

In light of the aforesaid information, an object of the present invention is to provide an organic electroluminescent element which possesses increased luminescent intensity and exhibits stable characteristics even with repeated use.

The present invention relates to an organic electroluminescent element having at least a positive electrode, luminescent layer, and negative electrode, wherein said negative electrode is a mixed layer of a plurality of metals having different work functions, and a higher percentage of metals having high work function is greater on the exterior side of said mixed layer.

BRIEF DESCRIPTION OF THE DRAWINGS

These and other objects and features of the present invention will become apparent from the following description of the preferred embodiments thereof taken in conjunction with the accompanying drawings, in which.

In the following description, like parts are designated by like reference numbers throughout the several drawings.

DETAILED DESCRIPTION OF THE PREFERRED EMBODIMENTS

Figure 1:
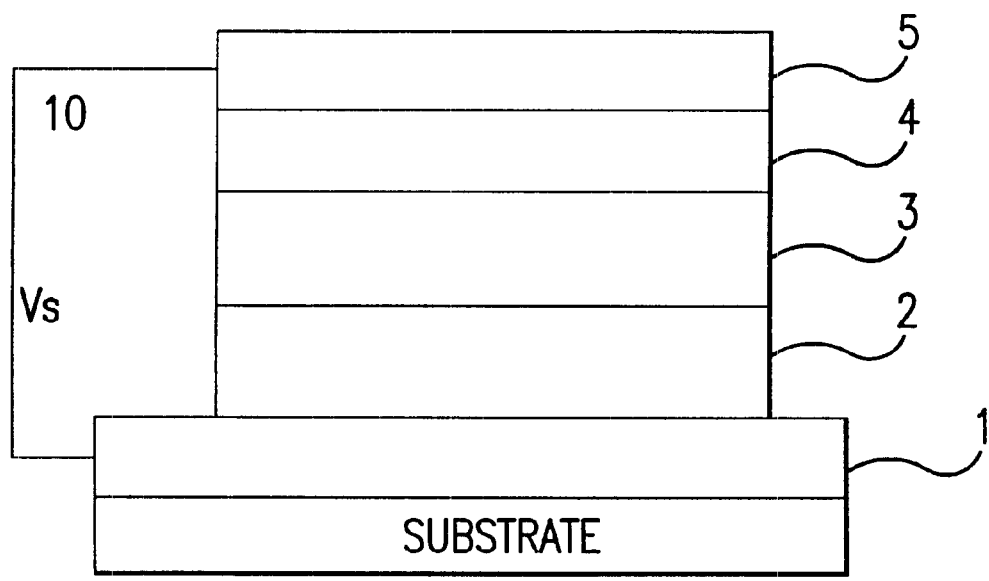
FIG. 1 is a brief section view showing an example of the structure of an organic electroluminescent element of the present invention.

The present invention relates to an organic electroluminescent element having at least a positive electrode, luminescent layer, and negative electrode, wherein said negative electrode is a mixed layer of magnesium and a metal having a work function higher than magnesium, and wherein the percentage of metal having a high work function is greater on the exterior side of said negative electrode.

The organic electroluminescent element of the present invention is provided with at least an organic luminescing layer interposed between a positive electrode and negative electrode.

The present invention is basically characterized by a negative electrode of an organic electroluminescent element which has a mixed layer of magnesium and metal having a work function greater than magnesium, said mixed layer having different mix ratios in the depth direction and a greater percentage of metal with a high work function disposed on the exterior side, i.e., the side farthest from the luminescing layer.

It is believed possible to improve electron injectability by using a mixed layer of magnesium and a metal having a work function greater than magnesium on the negative electrode, and providing a different mixture ratio in the depth direction so as to have an increasing the percentage of metal having a high work function on the exterior side of the negative electrode (i.e., on the opposite side relative to the luminescing layer) produces an extremely smooth electron flow in conjunction with a strong electric field, such that the luminescence starting voltage required to produce luminescence of the organic electroluminescent element of the present invention is adequately reduced and the work function of the negative electrode surface is increased so as to allow stable long-term luminescence by preventing the generation of black spots as well as deterioration caused by oxidation of the negative electrode surface. It is further believed that the negative electrode has superior layer formability due to the excellent layer forming characteristics of magnesium as an alloy, and that the formed element possesses luminescence characteristics of excellent stability due to the relatively excellent stability of the alloy compared to other metals. The present invention is based on the aforesaid knowledge.

A combination of magnesium having a work function less than 4 eV and metal having a higher work function is used as the metal forming the negative electrode of the present invention.

It is desirable to use a combination of magnesium, and least one metal from among aluminum, indium, silver, gold, nickel, and tin.

The negative electrode can be constructed of a plurality of layers such that the layers nearer the exterior surface have a larger percentage of metals with a work function greater than the interior layers, so as to increase the percentage of metal having a large work function on the exterior surface within the layers of the negative electrode. For example, when the negative electrode is formed of magnesium and silver, the structural ratio of the two layers can be inclined such that the layer formed on the outermost exterior surface has, for example, an Mg:Ag ratio of 1:2 and the interior layer has an Mg:Ag ratio of, for example, 10:1. Similarly, when a negative electrode is formed by a structure of three or more layers, a plurality of layers may be superimposed so that the layers on the exterior side has a higher percentage of metal having a large work function. The structural ratio may also be consecutively changed by increasing the vacuum deposition rate of the metal having a high work function, or by gradually decreasing the vacuum deposition rate f the metal having a smaller work function, when depositing the layers on the exterior surface when forming the negative electrode. The concentration of specific metal types also may be zero on the exterior side or interior side.

The ratio of magnesium and metal having a higher work function than magnesium may be set at an optional ratio insofar as the ratio of the metal having the higher work function is greater on the exterior side of the negative electrode element. That is, the concentration of magnesium actually may be zero on the exterior side of the negative electrode element. Conversely, the concentration of the metal having a larger work function actually may be zero on the interior side of the negative electrode element.

The percentage of metal having a higher work function should selectively be at least twice the concentration of magnesium on the exterior side of the negative electrode element, and desirably 5 times greater or more, and more desirably 10 times greater or more. The percentage of metal having higher-work function on the interior side of the negative electrode element is desirably at most less than 1/100, and preferably less than 1/20 of the magnesium concentration.

The negative electrode may be formed by a variety of well-known vacuum deposition methods such as normal resistance heating, spattering, EB vacuum deposition, ion plating, ionization vacuum deposition and the like of a mixture of magnesium and a metal having a high work function.

The thickness of the negative electrode is desirably 5~500 nm, and more desirably 10~300 nm. In the case of multiple layers, the total layer thickness is set within the aforesaid range. Since the resistance of the layer itself increases the thicker the layer, the applied voltage must be somewhat higher, whereas a uniform layer is difficult to form as the layer is made thinner, such that defects are likely to form which adversely affect luminous efficiency and shorten the service life of the organic electroluminescent element.

Materials having conductivity characteristics with a work function greater than 4 eV are useful as the positive electrode of the organic electroluminescent element including, for example, carbon, aluminum, vanadium, iron, cobalt, nickel, copper, zinc, tungsten, silver, tin, gold and the like as well as alloys thereof, as well as conductive metal compounds such as tin oxide, indium oxide, antimony oxide, zinc oxide, zirconium oxide and the like.

At least the positive electrode or negative electrode in the organic electroluminescent element must be transparent for the luminescence to be visible. In this instance, it is desirable that the positive electrode is transparent inasmuch as a negative electrode is subject to rapid loss of transparency.

When forming a transparent electrode, a conductive material such as the aforesaid metals is deposited on a substrate via a means such as vacuum deposition, spattering or the like, or means for dispersing and applying a resin containing said conductive material, or sol-gel method, so as to maintain desired transparency and conductivity.

The material used for the transparent substrate is not specifically limited insofar as said substrate is not adversely affected by heat during vacuum deposition or during manufacture of the organic electroluminescent element, it is possible to use a glass substrate, or transparent resin such as, for example, polyethylene, polypropylene, polyethersulfone, polyether ether ketone and the like. Well-known commercial products such as ITO, NESA and the like used to form a transparent electrode on a glass substrate may also be used.

The organic electroluminescent element of the present embodiment comprises, for example, the aforesaid positive electrode 1, negative electrode 4, and at least a hole injecting/transporting layer 2, and organic luminescing layer 3 interposed between said electrodes.

The hole injecting/transporting layer 2 formed on positive electrode 1 is desirably formed by vacuum deposition of a chemical compound, said chemical compound being dissolved in solvent or fluid in which a suitable resin is dissolved, and applied by dip coating or spin coating.

When forming the hole injecting/transporting layer by vacuum deposition, the thickness of said layer is normally 1~200 nm, and desirably 5~100 nm; when said layer is formed by an application method, the thickness of said layer is about 5~500 nm.

A thicker layer requires a higher application voltage to achieve luminescence, thereby adversely affecting luminous efficiency and causing deterioration of the organic electroluminescent element. Although luminous efficiency improves with a thinner layer, the layer readily breaks down and shortens the service life of the organic electroluminescent element.

Well-known material may be used as the hole injecting/transporting material in the hole injecting/transporting layer, for example, N,N'-diphenyl-N,N'-bis(3-methylphenyl)-1,1'-diphenyl-4,4'-diamine, N,N'-diphenyl-N,N'-bis(4-methylphenyl)-1,1'-diphenyl-4,4'-diamine, N,N'-diphenyl-N,N'-bis(1-naphthyl)-1,1'-diphenyl-4,4'-diamine, N,N'-diphenylN,N'-bis(2-naphthyl)-1,1'-diphenyl-4,4'-diamine, N,N'-tetra(4-methylphenyl)-1,1'-diphenyl-4,4'-diamine, N,N'-tetra(methylphenyl)-1,1'-bis(3-methylphenyl)-4,4'-diamine, N,N'-diphenyl-N,N'-bis(3-methylphenyl)-1,1'-bis(3-methylphenyl)-4,'-diamine, N,N'-bis(N-carbazolyl)-1,1'-diphenyl-4,4'-diamine, 4,4',4"-tris(N-carbazolyl)triphenylamine, N,N',N"-triphenyl-N,N',N"-tris(3-methylphenyl)-1,3,5-tri(4-aminophenyl)benzene, 4,4',4"-tris([N,N',N"-triphenyl-N,N',N"-tris(3-methylphenyl)]triphenylamine and the like. These materials may be used in combinations of two or more.

Next, an organic luminescing layer 3 is formed over the hole injecting/transporting layer 2. Well-known organic luminants may be used for the organic luminescing layer 3, for example, 2,5-bis[5,7-di-t-pentyl-2-benzooxazolyl]thiophene, 2,2'-(1,4-phenylenedivenylene)bisbenzothiazole, 2,2'-(4,4'-biphenylene)bisbisbenzothiazole, 5-methyl-2-{2-[4-(5-methyl-2-benzooxazolyl)phenyl]vinyl}benzooxazole, 2,5-bis(5-methyl-2-benzooxazolyl)thiophene, anthracene, naphthalene, phenanthrene, pyrene, chrysene, perylene, perynone, 1,4-diphenylbutadiene, tetraphenylbutadiene, cumarin, acridine, stilbene,2-(4-biphenyl)-6-phenylbenzooxazole, aluminum trisoxine, magnesium trisoxine, bis(benzo-8-quinolinole)zinc, bis(2-methyl-8-quinolinolaurate)aluminum oxide, indium trisoxine, aluminum tris(5-methyloxine), lithium oxine, galliumtrisoxine, calcium bis(5-chlorooxine), polyzinc-bis(8-hydroxy-5-quinolinolyl)methane, dilithium, zinc bisoxine, 1,2-phthaloperinone, 1,2-naphthaloperinone and the like.

Typical fluorescent dyes may also be used, including, for example, fluorescent cumarin dye, fluorescent perylene dye, fluorescent pyran dye, fluorescent thiopyran dye, fluorescent dye, fluorescent dye, fluorescent imidazole dye and the like. Among the aforesaid, chelated oxynoid compounds are particularly desirable.

Organic luminescing layer 3 may have a monolayer structure of the aforesaid luminescent material, or may have a multi-layer structure to regulate characteristics such as color of luminescence, intensity of luminescence and the like. Furthermore, luminescent material such as rubrene, pyrin and the like may be doped, or the aforesaid materials may be used in mixtures of two or more types.

When forming the organic luminescing layer via vacuum deposition, the thickness of said layer is normally 1~200 nm, and desirably 1~100 nm, whereas when said layer is formed by an application method, the thickness of said layer may be 5~500 nm. A thicker layer requires a higher application voltage to achieve luminescence, thereby adversely affecting luminous efficiency and causing deterioration of the organic electroluminescent element. Although luminous efficiency improves with a thinner layer, the layer readily breaks down and shortens the service life of the organic electroluminescent element.

Then, the aforesaid negative electrode 4 is formed over the organic luminescing layer 3. The transparent electrodes negative electrode 4 and positive electrode 1 are connected by a suitable lead wire 11 of nickel-chrome wire, gold wire, copper wire, platinum wire or the like, such that the organic electroluminescent element luminesces by the application of a suitable voltage Vs to both electrodes.

Figure 2:
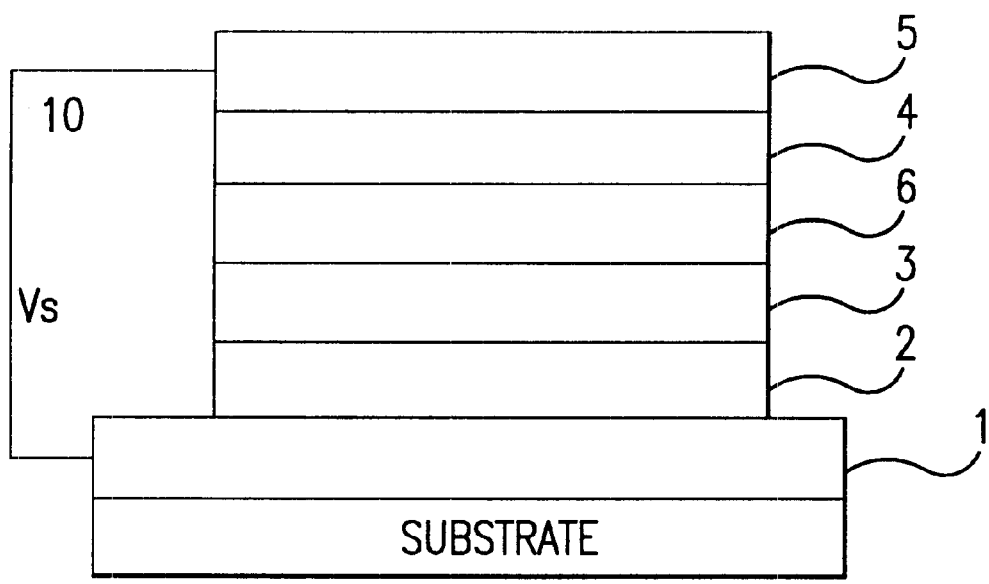
FIG. 2 is a brief section view showing an example of the structure of an organic electroluminescent element of the present invention.
Figure 3:
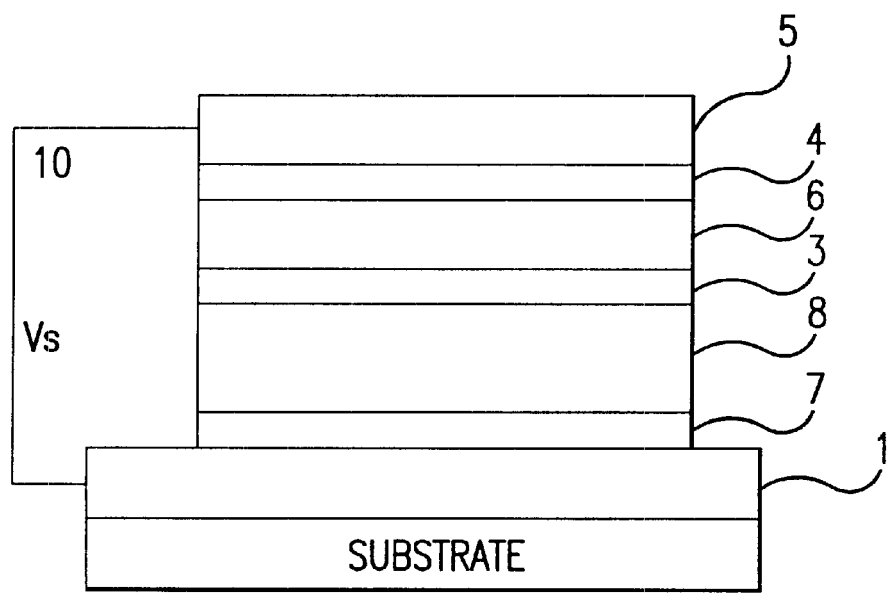
FIG. 3 is a brief section view showing an example of the structure of an organic electroluminescent element of the present invention.
Figure 4:
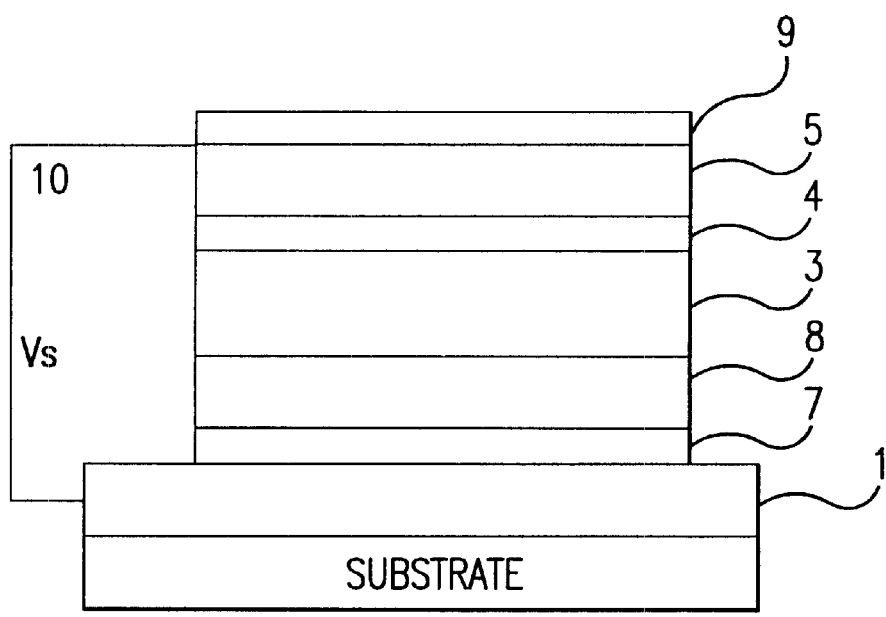
FIG. 4 is a brief section view showing an example of the structure of an organic electroluminescent element of the present invention.

Another construction of the organic electroluminescent element is shown in FIGS. 2~4. In FIG. 2, reference number 1 refers to a positive electrode, over which are sequentially superimposed a hole injecting/transporting layer 2, organic luminescing layer 3, electron injecting/transporting layer 5, and negative electrode 4, said negative electrode 4 being a mixed layer of two types of alloys having different work functions with the mixture ratio differing in the depth direction such that the percentage of metal having a higher work function is greater on the exterior surface side.

In FIG. 3, reference number 1 refers to a positive electrode, over which is sequentially superimposed a hole injecting layer 6, hole transporting layer 7, organic luminescing layer 3, electron transporting layer 8, electron injecting layer 9, and negative electrode 4, said negative electrode 4 being a mixed layer of two types of alloys having different work functions with the mixture ratio differing in the depth direction such that the percentage of metal having a higher work function is greater on the exterior surface side.

In FIG. 4, reference number 1 refers to a positive electrode over which is sequentially superimposed a hole injecting layer 6, hole transporting layer 7, organic luminescing layer 3, electron injecting/transporting layer 5, and negative electrode 4, and sealing layer 10, said negative electrode 4 being a mixed layer of two types of alloys having different work functions with the mixture ratio differing in the depth direction such that the percentage of metal having a higher work function is greater on the exterior surface side.

The electroluminescent element of the construction shown in FIG. 2 differs from the construction of the electroluminescent element of FIG. 1 in that it is provided with an electron injecting/transporting layer 5 interposed between negative electrode 4 and organic luminescing layer 3. The electron injecting/transporting layer is provided to accelerate electron injection and transport.

The electron injecting/transporting layer may be formed using electron transporting material, for example, oxadiazole derivative, thiadiazole derivative, chelated oxynoid compound, benzothiazole complex, benzooxazole complex, and mixtures thereof.

The electron injecting/transporting layer may be formed by well-known conventional methods such as vacuum deposition and application methods; when forming the layer by vacuum deposition the layer thickness may be 1~500 nm, and when forming the layer by application methods the layer thickness may be 5~1,000 nm.

The structure shown in FIG. 3 provides, in comparison to the structure of FIG. 1, a function-separated structure wherein the hole injecting-transporting layer of FIG. 1 is function-separated into two layers of hole injecting layer 6 and hole transporting layer 7. Hole injecting layer 6 may be formed using well-known materials, e.g., phthalocyanine compound, conductive high polymers, arylamine compounds and the like formed to a layer thickness of about 1~30 nm via means such as vacuum deposition and like methods. Hole transporting layer 6 may be formed of well-known materials, e.g., benzidine compound, arylamine compound, styryl compound and the like formed to a layer thickness of about 10~200 nm via means such as vacuum deposition and the like.

As shown in FIG. 3, the hole injecting/transporting layer may be formed in a function-separated structure comprising a hole injecting layer and hole transporting layer particularly by forming a layer of a material having high hole injecting characteristics on the negative electrode side. Such a hole injecting layer may be formed via vacuum deposition and the like using a mixture of the aforesaid electron transporting material and a metal having a work function of less than 4 eV. Examples of usable metals include magnesium, calcium, titanium, yttrium, lithium, gadolinium, ytterbium, ruthenium, manganese, and alloys thereof. The thickness of the electron transporting layer may be about 1~200 nm, and the thickness of the electron injecting layer may be about 0.1~30 nm.

When the sealing layer 10 is formed as shown in FIG. 4, the sealing layer is formed using compounds such as silicone oxide, zinc oxide, manganese fluoride, magnesium oxide and the like to form a thin layer about 5~1,000 nm in thickness via vacuum deposition.

The organic electroluminescent element of the present embodiment is suitable for various types of display devices.

The present invention is described hereinafter by way of examples.

EXAMPLE 1

A thin hole injecting/transporting layer was formed on a glass substrate coated with indium-tin oxide via vacuum deposition using N,N'-diphenyl-N,N'-bis(3-methylphenyl)-1,1'-diphenyl-4,4'-diamine to form a layer 60 nm in thickness.

A thin layer of aluminum trisoxine 60 nm in thickness was superimposed over the aforesaid hole injecting/transporting layer via vacuum deposition to form an organic luminescing layer.

Then, magnesium and silver were vacuum deposited together to form a thin layer 100 nm in thickness with an atomic ratio of 10:1 to form a negative electrode. A thin layer of magnesium and silver about 100 nm in thickness was then co-deposited over the aforesaid layer via resistance heating at an atomic ratio of 1:2.

The organic electroluminescent element was produced in this manner.

The magnesium used has a work function of 3.66 eV.

The silver used had a work function of 4.26 ev.

The work function values are data recorded in The Journal of Applied Physics, 4th Ed. (1977), p.4729. Data appearing the following examples and reference examples are from the same source. The work function of indium is recorded in the Chemical Handbook.

EXAMPLE 2

A thin hole injecting/transporting layer was formed on a glass substrate coated with indium-tin oxide via vacuum deposition using N,N'-diphenyl-N,N'-bis(3-methylphenyl)-1,1'-diphenyl-4,4'-diamine to form a layer 60 nm in thickness.

A thin layer of aluminum trisoxine 60 nm in thickness was superimposed over the aforesaid hole injecting/transporting layer via vacuum deposition to form an organic luminescing layer.

Then, magnesium and silver were co-deposited via vacuum deposition to form a thin layer 50 nm in thickness with an atomic ratio of 10:1 to form a negative electrode. A thin layer of magnesium and silver about 100 nm in thickness was then co-deposited over the aforesaid layer via resistance heating at an atomic ratio of 1:5.

The organic electroluminescent element was produced in this manner.

The magnesium used has a work function of 3.66 eV.

The silver used had a work function of 4.26 eV.

EXAMPLE 3

A thin hole injecting/transporting layer was formed on a glass substrate coated with indium-tin oxide via vacuum deposition using N,N'-diphenyl-N,N'-bis(3-methylphenyl)-1,1'-diphenyl-4,4'-diamine to form a layer 60 nm in thickness.

A thin layer of aluminum trisoxine 60 nm in thickness was superimposed over the aforesaid hole injecting/transporting layer via vacuum deposition to form an organic luminescing layer.

Then, magnesium and indium were vacuum deposited together to form a thin layer 60 nm in thickness with an atomic ratio of 10:1 to form a negative electrode. A thin layer of magnesium and indium about 140 nm in thickness was then co-deposited over the aforesaid layer via resistance heating at an atomic ratio of 1:5.

The organic electroluminescent element was produced in this manner.

The magnesium used has a work function of 3.66 eV.

The indium used had a work function of 4.09 eV.

Reference Example 1

An organic electroluminescent element was prepared in the same manner as in Example 1 with the exception that the negative electrode was formed by co-depositing magnesium and silver via resistance heating at an atomic ratio of 10:1 and layer thickness of 100 nm.

The magnesium used has a work function of 3.66 eV.

The silver used had a work function of 4.26 eV.

Reference Example 2

A thin hole injecting/transporting layer was formed on a glass substrate coated with indium-tin oxide via vacuum deposition using N,N'-diphenyl-N,N'-bis(1-naphthyl)-1,1'-diphenyl-4,4'-diamine to form a layer 55 nm in thickness.

A thin, 10 nm thick layer of 5 wt % doped rubrene in aluminum trisoxine was superimposed over the aforesaid hole injecting/transporting layer via vacuum deposition, and over this was superimposed a thin, 45 nm thick layer of aluminum trisoxine via vacuum deposition to form an organic luminescing layer.

Then, aluminum and lithium were co-deposited by resistance heating to form a thin layer 150 nm in thickness with an atomic ratio of 20:1 to form a negative electrode.

The organic electroluminescent element was produced in this manner.

The aluminum used has a work function of 4.28 eV.

The lithium used had a work function of 2.9 eV.

EXAMPLE 4

A thin hole injecting/transporting layer was formed on a glass substrate coated with indium-tin oxide via vacuum deposition using N,N'-diphenyl-N,N'-bis(1-naphthyl)-1,1'-diphenyl-4,4'-diamine to form a layer 55 nm in thickness.

A thin, 10 nm thick layer of 5 wt % doped rubrene in aluminum trisoxine was superimposed over the aforesaid hole injecting/transporting layer via vacuum deposition, and over this was superimposed a thin, 45 nm thick layer of aluminum trisoxine via vacuum deposition to form an organic luminescing layer.

Then, magnesium and indium were co-deposited by resistance heating to form a thin layer with an initial atomic ratio of 20:1, and the deposition rate of the indium was gradually accelerated while the deposition rate of the magnesium was gradually reduced to ultimately form a negative electrode 200 nm in thickness.

The organic electroluminescent element was produced in this manner.

The magnesium used has a work function of 3.66 eV.

The indium used had a work function of 4.09 ev.

Reference Example 3

An organic electroluminescent element was prepared in the same manner as in Example 4 with the exception that the negative electrode was formed by depositing magnesium via resistance heating to achieve a layer thickness of 200 nm.

The magnesium used has a work function of 3.66 eV.

Evaluations

The organic electroluminescent elements prepared in Examples 1~4 and Reference Examples 1~3 were evaluated by measuring the voltage V required to start luminescence when a DC voltage was gradually applied, luminance brightness (cd/m2) when a 5 V DC voltage was applied, and luminance brightness (cd/m2) when a 10 V DC voltage was applied.

The loss rate (%) of initial output when operated for 5 hr at a current density of 5 mA/cm2 was determined (i.e., [output after 5 hr (mW/cm2)/initial output (mW/cm2)×100 ]).

Measurement results are shown in Table 1.

TABLE 1

|  | Luminescence Starting Voltage | Brightness at 5 V (cd/m2) | Brightness at 10 V (cd/m2) | Drop in initial output (%) |
| --- | --- | --- | --- | --- |
| Ex. 1 | 3.5 | 30 | 4650 | 92 |
| Ex. 2 | 3.5 | 27 | 4570 | 93 |
| Ex. 3 | 3.5 | 32 | 5120 | 93 |
| Ref Ex. 1 | 3.5 | 30 | 3920 | 86 |
| Ref Ex. 2 | 3.0 | 75 | 8942 | 89 |
| Ex. 4 | 3.5 | 35 | 5640 | 93 |
| Ref Ex. 3 | 3.5 | 37 | 4025 | 85 |

As can be understood from Table 1, the organic electroluminescent element of the present invention starts luminescing at a low potential and exhibit excellent luminance brightness.

The organic electroluminescent element of the present invention exhibits only slight output reduction, and stable luminance over a long period was observed.

The organic electroluminescent element of the present invention achieves superior luminance efficiency and luminance brightness, and improved durability, and is not restricted as to luminescent material, luminescence-enhancing material, charge-transporting material, sensitizers, resins, positive electrode materials, nor in the method of manufacturing the element.

The present invention provides an organic electroluminescent element which increases luminance intensity via a negative electrode of novel construction, and achieves excellent durability by reducing the luminance starting voltage.

Although the present invention has been fully described by way of examples with reference to the accompanying drawings, it is to be noted that various changes and modification will be apparent to those skilled in the art. Therefore, unless otherwise such changes and modifications depart from the scope of the present invention, they should be construed as being included therein.

What is claimed is:

1. An organic electroluminescent element comprising:

a positive electrode;

a luminescing layer; and a negative electrode comprising a compound layer of magnesium and a metal having a work function higher than magnesium, said compound layer having a exterior side comprising magnesium and the metal, said exterior side having a higher percentage of the metal than magnesium, said exterior side having a different ratio of the metal to magnesium than a ratio of the metal to magnesium to another location of said compound layer;

wherein the amount of the metal on the side of the negative electrode nearest the luminescing layer is less than 1/10 the total content of magnesium.

2. The organic electroluminescent element of claim 1, wherein the amount of the metal on the side of the negative electrode nearest the luminescing layer is less than 1/20 the total content of magnesium.

3. An organic electroluminescent element comprising:

a positive electrode;

a luminescing layer; and a negative electrode comprising a compound layer comprising magnesium and a metal having a work function higher than magnesium, said compound layer having an exterior side comprising magnesium and the metal, said exterior side having a higher percentage of the metal than magnesium, said exterior side having a different ratio of the metal to magnesium than a ratio of the metal to magnesium at another location of said compound layer;

wherein the amount of the metal on the side of the negative electrode nearest the luminescing layer is less than 1/20 the total content of magnesium;

wherein the percentage of the metal changes in a direction from the exterior side of the compound layer extending to an interior side of the compound layer, the highest percentage of the metal being on an exterior surface of the negative electrode.

4. An organic electroluminescent element comprising:

a positive electrode;

a negative electrode comprising a compound layer of magnesium and a metal comprising a work function higher than that of magnesium, said compound layer comprising a higher percentage of magnesium than the metal on an interior side of said compound layer;

a luminescing layer disposed between said positive electrode and said negative electrode; and a sealing layer provided on an exterior side of the element.

5. The organic electroluminescent element of claim 4, wherein said sealing layer comprises an inorganic compound.

6. The organic electroluminescent element of claim 5, wherein the inorganic material is a material selected from the group consisting of silicone oxide, zinc oxide, manganese fluoride and magnesium oxide.

7. An organic electroluminescent element comprising:

a positive electrode;

a negative electrode comprising a single compound layer of magnesium and a metal comprising a work function higher than that of magnesium, said compound layer comprising a higher percentage of magnesium than the metal on an interior side of said compound layer, wherein a percentage of the metal gradually changes in the direction of the thickness of the compound layer, and the highest percentage of the metal is on an exterior surface of the negative electrode; and a luminescing layer disposed between said positive electrode and said negative electrode.

8. Organic electroluminescent element comprising:

a positive electrode;

a negative electrode comprising a compound layer comprising magnesium and a metal having a work function higher than magnesium, said compound layer having an exterior side comprising magnesium and the metal and an interior side comprising magnesium and the metal, said exterior side having a higher percentage of the metal than magnesium, said interior side having a higher percentage of magnesium than the metal; and a luminescing layer disposed between the positive electrode and the negative electrode.

9. The organic electroluminescent element of claim 8, further comprising an electron injecting layer disposed between the negative electrode and the luminescing layer.

10. The organic electroluminescent element of claim 9, wherein a thickness of the negative electrode is 10–300 nm.

11. The organic electroluminescent element of claim 8, wherein the metal is at least one metal selected from the group consisting of aluminum, indium, silver, gold, nickel, and tin.

12. The organic electroluminescent element of claim 8, wherein the metal is silver or indium.

13. The organic electroluminescent element of claim 8, wherein a thickness of said negative electrode is 5–500 nm.

14. The organic electroluminescent element of claim 13, wherein a thickness of said negative electrode is 10–200 nm.

15. The organic electroluminescent element of claim 8, wherein said negative electrode is formed by resistance heating, spattering, EB vacuum deposition, ion plating, or ionization deposition.

16. The organic electroluminescent element of claim 8, wherein said compound layer comprises a plurality of layers comprising a first layer and a second layer, wherein a concentration of the metal in the first layer is higher than a concentration of the metal in the second layer.

17. The organic electroluminescent element of claim 16, wherein the plurality of layers comprise both magnesium and the metal.

18. The organic electroluminescent element of claim 8, wherein said compound layer comprises a plurality of layers, such that the percentage of the metal is highest in the layer on the exterior side of the element.

19. The organic electroluminescent element of claim 8, further comprising an electron injection/transporting layer interposed between said negative electrode and luminescing layer.

* * * * *